(12) United States Patent    (10) Patent No.: US 8,717,211 B2
Miao et al.                  (45) Date of Patent:    May 6, 2014

(54) ADAPTIVE GAIN ADJUSTMENT SYSTEM

(75) Inventors: Guoqing Miao, San Diego, CA (US); William C. Scofield, San Diego, CA (US); Derick R. Hugunin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 130 days.

(21) Appl. No.: 13/047,675

(22) Filed: Mar. 14, 2011

(65) Prior Publication Data

US 2012/0133411 A1    May 31, 2012

Related U.S. Application Data

(60) Provisional application No. 61/418,366, filed on Nov. 30, 2010.

(51) Int. Cl.
*H03M 1/00* (2006.01)

(52) U.S. Cl.
USPC ............... 341/139; 341/118; 341/144

(58) Field of Classification Search
CPC ........................................... H03M 3/51
USPC ........................... 341/139, 118, 144
See application file for complete search history.

(56) References Cited

U.S. PATENT DOCUMENTS

| | | | |
|---|---|---|---|
| 3,700,871 A * | 10/1972 | Montgomery et al. | 341/139 |
| 3,813,609 A * | 5/1974 | Wilkes et al. | 330/51 |
| 4,355,304 A | 10/1982 | Kasuga et al. | |
| 4,507,619 A | 3/1985 | Dijkstra et al. | |
| 4,771,267 A * | 9/1988 | Russell et al. | 341/118 |
| 5,442,317 A | 8/1995 | Stengel | |
| 5,541,600 A | 7/1996 | Blumenkrantz et al. | |
| 5,777,519 A | 7/1998 | Simopoulos | |
| 5,821,889 A | 10/1998 | Miller | |
| 6,088,461 A | 7/2000 | Lin et al. | |
| 6,226,193 B1 | 5/2001 | Bayer et al. | |

(Continued)

FOREIGN PATENT DOCUMENTS

| | | |
|---|---|---|
| CN | 1722611 A | 1/2006 |
| CN | 101014209 A | 8/2007 |

(Continued)

OTHER PUBLICATIONS

International Search Report and Written Opinion—PCT/US2011/062729—ISA/EPO—Feb. 21, 2012.

(Continued)

*Primary Examiner* — Jean B Jeanglaude

(74) *Attorney, Agent, or Firm* — Ramin Mobarhan

(57) ABSTRACT

Techniques for adaptive gain adjustment in a signal processing path to achieve greater dynamic range. In an exemplary embodiment, a digital gain is applied to a digital input signal based on a detected level of the digital input signal. A corresponding analog gain is applied to the output of a digital-to-analog converter for converting the digital input signal to an analog signal, the product of the digital gain and the analog gain being kept constant. In an exemplary embodiment, a zero cross detector is employed to update the digital and analog gains only in the vicinity of zero crossings detected in the signal. In a further exemplary embodiment, a peak detector is employed to instantaneously adjust the digital and analog gains to avoid clipping in the signal path.

32 Claims, 8 Drawing Sheets

(56) References Cited

U.S. PATENT DOCUMENTS

| | | |
|---|---|---|
| 6,236,394 B1 | 5/2001 | Ikeda |
| 6,240,191 B1 | 5/2001 | Yoon |
| 6,353,404 B1 * | 3/2002 | Kuroiwa ............... 341/144 |
| 6,411,531 B1 | 6/2002 | Nork et al. |
| 6,489,909 B2 * | 12/2002 | Nakao et al. ............ 341/144 |
| 6,504,422 B1 | 1/2003 | Rader et al. |
| 6,522,273 B1 * | 2/2003 | Fei et al. ............... 341/139 |
| 6,531,902 B1 | 3/2003 | Tennen et al. |
| 6,657,875 B1 | 12/2003 | Zeng et al. |
| 6,763,114 B1 | 7/2004 | Nalbant |
| 6,995,995 B2 | 2/2006 | Zeng et al. |
| 7,027,482 B1 | 4/2006 | Nomura |
| 7,110,559 B2 | 9/2006 | Behboodian et al. |
| 7,224,591 B2 | 5/2007 | Kaishita et al. |
| 7,250,810 B1 | 7/2007 | Tsen |
| 7,271,642 B2 | 9/2007 | Chen et al. |
| 7,385,443 B1 | 6/2008 | Denison |
| 7,411,799 B2 | 8/2008 | Muggler et al. |
| 7,453,316 B2 | 11/2008 | Shimizu |
| 7,456,677 B1 | 11/2008 | Rao et al. |
| 7,505,824 B2 | 3/2009 | Ebi et al. |
| 7,554,385 B2 | 6/2009 | Ishida |
| 7,583,149 B2 | 9/2009 | Funaki et al. |
| 7,583,213 B2 * | 9/2009 | Wang et al. ............ 341/139 |
| 7,623,053 B2 | 11/2009 | Terry et al. |
| 7,679,435 B2 | 3/2010 | Tsuji et al. |
| 7,746,676 B2 | 6/2010 | Feng et al. |
| 7,782,141 B2 | 8/2010 | Witmer et al. |
| 7,830,209 B1 | 11/2010 | Woodford et al. |
| 7,847,621 B2 | 12/2010 | Oyama et al. |
| 8,189,802 B2 | 5/2012 | Miao et al. |
| 2003/0098805 A1 * | 5/2003 | Bizjak ................... 341/139 |
| 2004/0141558 A1 | 7/2004 | Plisch et al. |
| 2005/0147262 A1 | 7/2005 | Breebaart |
| 2005/0270086 A1 | 12/2005 | Sohara |
| 2006/0006855 A1 | 1/2006 | Feng et al. |
| 2006/0092063 A1 | 5/2006 | Ido et al. |
| 2007/0024347 A1 | 2/2007 | Nagasawa et al. |
| 2007/0159233 A1 | 7/2007 | Sohara |
| 2007/0249304 A1 | 10/2007 | Snelgrove et al. |
| 2007/0279021 A1 | 12/2007 | Yanagida et al. |
| 2008/0044041 A1 | 2/2008 | Tucker et al. |
| 2008/0123873 A1 | 5/2008 | Bjorn-Josefsen et al. |
| 2008/0161108 A1 | 7/2008 | Dahl et al. |
| 2009/0051429 A1 | 2/2009 | Shen et al. |
| 2009/0154442 A1 | 6/2009 | Kang et al. |
| 2009/0220110 A1 | 9/2009 | Bazarjani et al. |
| 2010/0026374 A1 | 2/2010 | Jung |
| 2010/0219888 A1 | 9/2010 | Lesso |
| 2010/0253420 A1 | 10/2010 | Xiao et al. |
| 2010/0259330 A1 | 10/2010 | Nakai et al. |
| 2010/0277152 A1 | 11/2010 | MacFarlane |
| 2011/0204961 A1 | 8/2011 | Galal et al. |
| 2011/0274295 A1 | 11/2011 | Motoki |
| 2012/0235730 A1 | 9/2012 | Quan et al. |

FOREIGN PATENT DOCUMENTS

| | | |
|---|---|---|
| CN | 101123398 A | 2/2008 |
| DE | 19963648 A1 | 7/2001 |
| EP | 0144143 A2 | 6/1985 |
| GB | 2444988 A | 6/2008 |
| JP | 56131210 | 10/1981 |
| JP | 57023309 A | 2/1982 |
| JP | 58084509 A | 5/1983 |
| JP | H05226943 | 9/1993 |
| JP | 6061753 A | 3/1994 |
| JP | 6314936 A | 11/1994 |
| JP | 10014218 A | 1/1998 |
| JP | H10341114 A | 12/1998 |
| JP | 2002043874 A | 2/2002 |
| JP | 2002064339 A | 2/2002 |
| JP | 2006033204 A | 2/2006 |
| JP | 2006129366 A | 5/2006 |
| JP | 2006516377 A | 6/2006 |
| JP | 2006518131 A | 8/2006 |
| JP | 2006518133 A | 8/2006 |
| TW | 200300307 | 5/2003 |
| WO | 9960524 A1 | 11/1999 |
| WO | 2004091091 A1 | 10/2004 |
| WO | 2006102313 A2 | 9/2006 |
| WO | 2008024666 A2 | 2/2008 |
| WO | 2009074779 A1 | 6/2009 |

OTHER PUBLICATIONS

Gaalaas E., "Class D Audio Amplifiers: What, Why, and How", Analog Dialogue, Analog Devices, vol. 40, No. 2, Jan. 7, 2010.

Ido T., et al., "A Digital Input Controller for Audio Class-D Amplifiers with 100W 0.004% THD+N and 113dB DR", ISSCC 2006, Session 19, Analog Techniques, 19.3, pp. 1-10, Feb. 7, 2006.

Jakonis, D., et al., "A 2.4-GHz RF sampling receiver front-end in 0.18μm CMOS," Solid-State Circuits, IEEE Journal of, vol. 40, No. 6, pp. 1265-1277, Jun. 2005.

Su, David K., et al., "A CMOS Oversampling D/A Converter With a Current-Mode Semidigital Reconstruction Filter" IEEE Journal of Solid-State Circuits, IEEE Service Center, Piscataway, NJ, US LNKD-DOI:10.1109/4.261996, vol. 28, No. 12, Dec. 1, 1993, pp. 1224-1233, XP000435895.

* cited by examiner

| DETECTED SIGNAL LEVEL ZONE | TARGET GAIN SETTING |
|---|---|
| $y < Y.1$ | $G.1$ |
| $Y.1 \leq y < Y.2$ | $G.2$ |
| ⋮ | ⋮ |
| $Y.(N-1) \leq y < Y.N$ | $G.N$ |

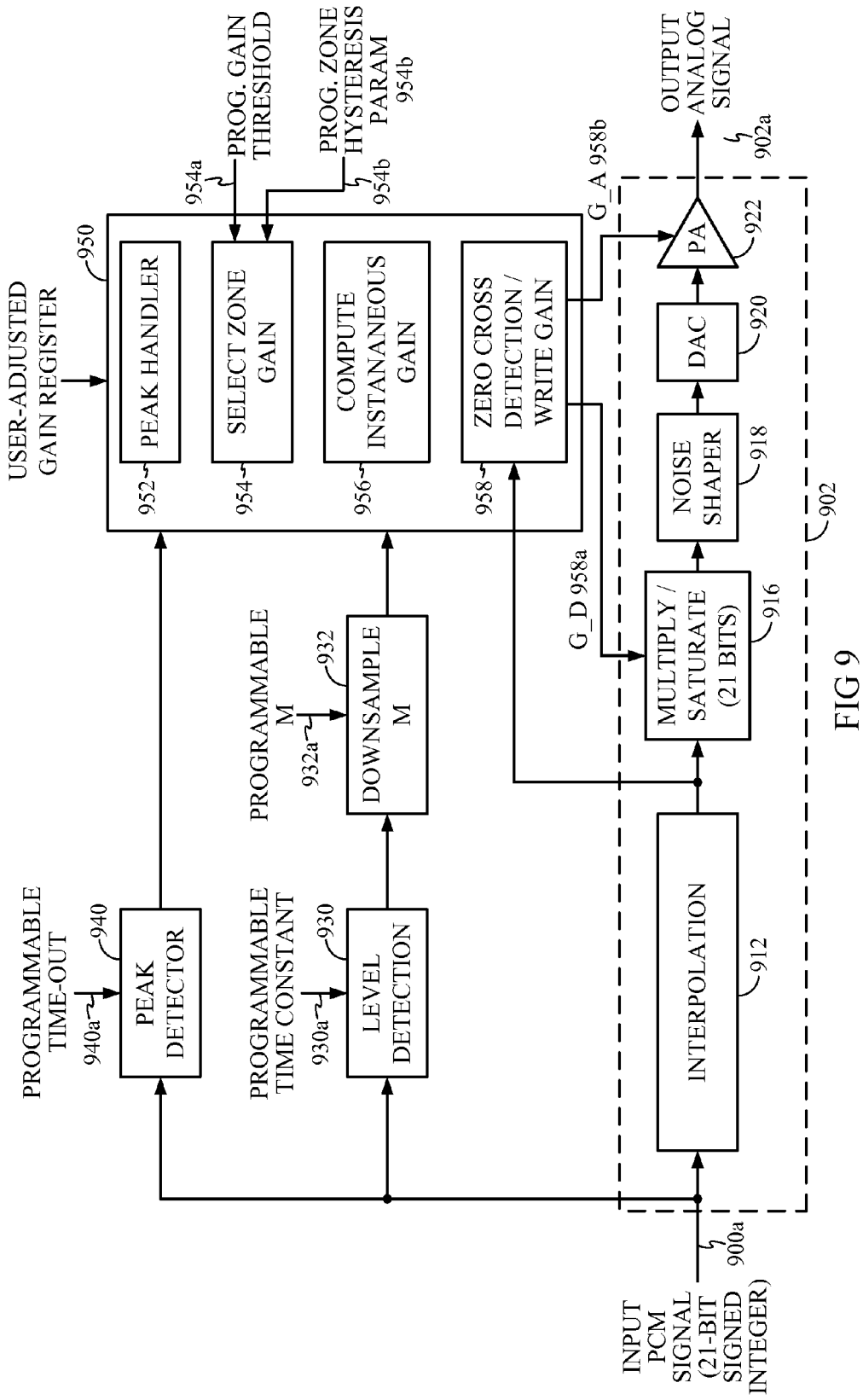

ADAPTIVE GAIN ADJUSTMENT SYSTEM

CLAIMS OF PRIORITY UNDER 35 U.S.C. §119

The present Application for Patent claims priority to Provisional Application No. 61/418,366, entitled "Dynamic range enhancement and power consumption reduction in audio codecs" filed Nov. 30, 2010, and assigned to the assignee hereof and hereby expressly incorporated by reference herein.

RELATED APPLICATIONS

This application is related to U.S. patent application Ser. No. 12/041,414, entitled "System and Method for Reducing Power Consumption for Audio Playback," filed Mar. 3, 2008, the contents of which are hereby incorporated by reference herein in their entirety.

BACKGROUND

1. Field

The disclosure relates to signal processing, and in particular, to a system for adaptive gain adjustment in a signal processing path to enhance dynamic range and lower power consumption.

2. Background

Signal processing paths in modern electronic systems may include a digital processing section, a data converter, and an analog processing section. Examples of such systems include audio processing systems wherein an audio signal is digitally processed prior to conversion to an analog signal, other media processing systems, as well as various types of control systems. Typically, the digital section may include a digital signal processor (DSP) adapted to receive an digital input signal and apply various types of digital processing, such as filtering, frequency upsampling, and/or other control processing. The output of the digital section may be coupled to a digital-to-analog converter (DAC) to convert the processed digital signal to an analog signal. The analog section may further include processing blocks such as filters and amplifiers. Typical analog amplifiers may include a power amplifier (PA) to increase the power level of the analog signal to sufficiently drive a subsequent stage.

In the aforementioned signal path, there may be several potential noise sources which may undesirably limit the dynamic range of the processed signals. These include, e.g., digital quantization noise, which includes the quantization noise from the digital input signal as well as any noise shaper used to process the digital signal, DAC circuit noise, and power amplifier circuit noise. Furthermore, several factors may contribute to the overall power consumption of the signal path, including, e.g., digital power consumption from any interpolation filter and/or noise shaper, DAC power consumption, which may depend on the clock rate used for D-to-A conversion, and power amplifier power consumption.

To reduce overall output noise, it may be desirable to pre-amplify the digital signal early in the signal path to provide the signal with sufficient gain to overcome noise from the subsequent stages of the signal path. Any subsequent amplification by analog circuitry may then be correspondingly reduced to maintain a constant overall gain. As a result of applying such gains in the signal path, the overall power consumption required to achieve a given dynamic range for the signal path may be reduced.

It would be desirable to provide efficient techniques for deriving and applying the aforementioned gains in the signal path to reduce noise and power consumption for the overall system.

BRIEF DESCRIPTION OF THE DRAWINGS

FIG. 9 illustrates an exemplary embodiment of a signal path and associated processing for an audio CODEC according to the techniques of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
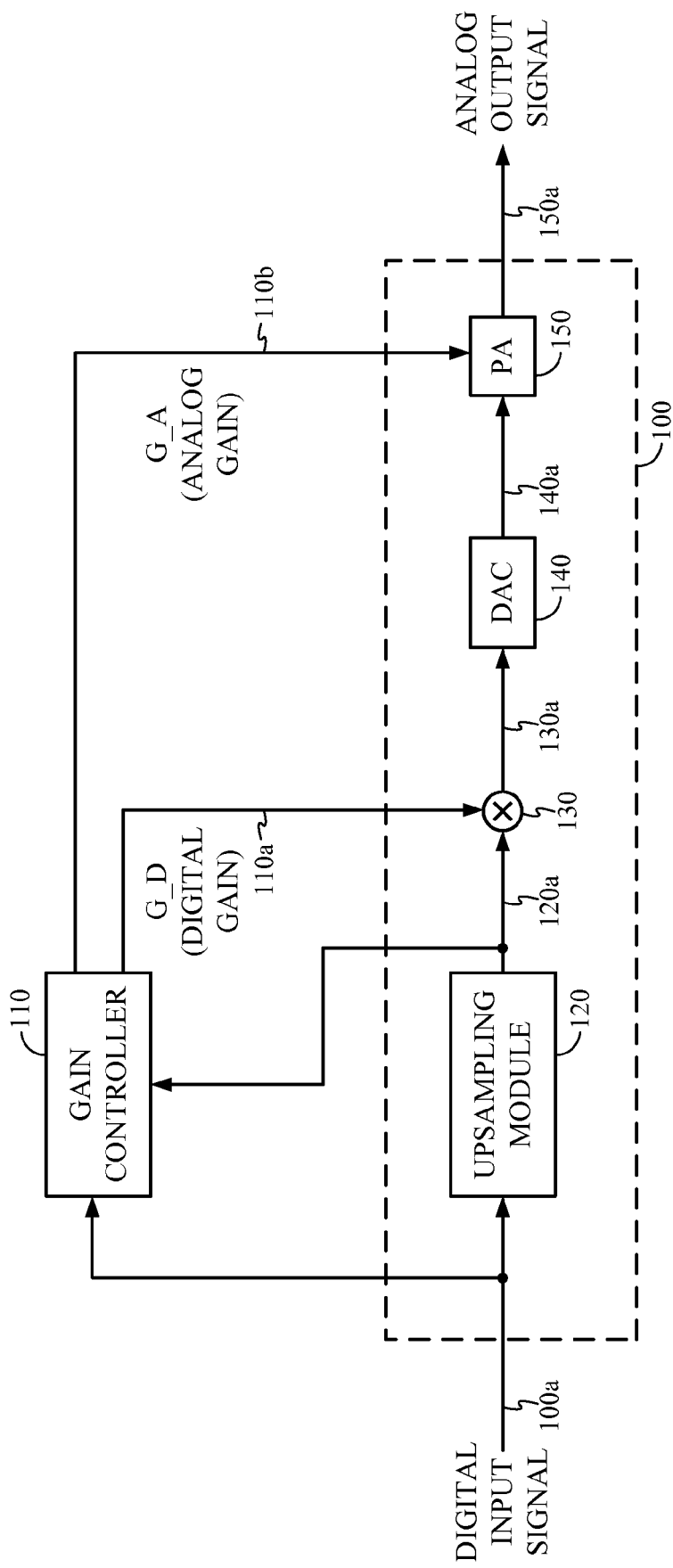
FIG. 1 illustrates an exemplary embodiment of an adaptive gain system according to the present disclosure.

FIG. 1 illustrates an exemplary embodiment of an adaptive gain system according to the present disclosure. Note FIG. 1 is shown for illustrative purposes only, and is not meant to restrict the scope of the present disclosure to any particular exemplary embodiments of the techniques described.

In FIG. 1, a digital input signal 100a is provided to a signal path 100. The signal path 100 includes an upsampling module 120 for upsampling the frequency of the digital input signal 100a to increase the digital signal sampling rate. In an exemplary embodiment (not shown), the upsampling module 120 may include, e.g., an interpolator for upsampling the digital input signal 100a in frequency. In certain alternative exemplary embodiments, the upsampling module 120 may further include a zero-order hold (ZOH) module, or a general cascaded integrator-comb (CIC) filter known in the art. It will be appreciated that in some exemplary embodiments, a ZOH module or CIC filter need not be present, and such alternative exemplary embodiments are contemplated to be within the scope of the present disclosure.

The output signal 120a of the upsampling module 120 is provided to a digital multiplier 130. The digital multiplier 130 multiplies the signal 120a with a digital gain G_D 110a as supplied by a gain controller 110, which determines the digital gain G_D 110a as a function of the digital input signal 100a level. Note the gain controller 110 may further process the output signal 120a of the upsampling module 120 to determine, e.g., the appropriate timing for applying the calculated adaptive gains.

The output signal 130a of the digital multiplier 130 is provided to a digital-to-analog converter (DAC) 140, which generates an analog signal 140a corresponding to the digital signal 130a. The analog signal 140a is then provided to a power amplifier 150, which applies an analog gain G_A 110b that is also supplied by the gain controller 110. The power amplifier 150 generates an analog output signal 150a.

In an exemplary embodiment, the gain controller 110 may be configured to set the digital gain G_D 110a and the analog gain G_A 110b inversely proportional to each other, i.e., the product of G_D and G_A (both expressed linearly) remains constant. According to the principles of the present disclosure, by adaptively increasing G_D when the digital input signal 100a level is low, and decreasing G_D when the digital input signal 100a level is high, the dynamic range of the overall system may be advantageously improved, while power consumption may also be reduced.

Note in alternative exemplary embodiments (not shown), a separate analog amplifier may be placed in series with the power amplifier 150 in the signal path 100, and the variable analog gain G_A 110b may instead be applied by such separate analog amplifier to compensate for changes in the digital gain G_D 110a. Such alternative exemplary embodiments are contemplated to be within the scope of the present disclosure.

Figure 2:
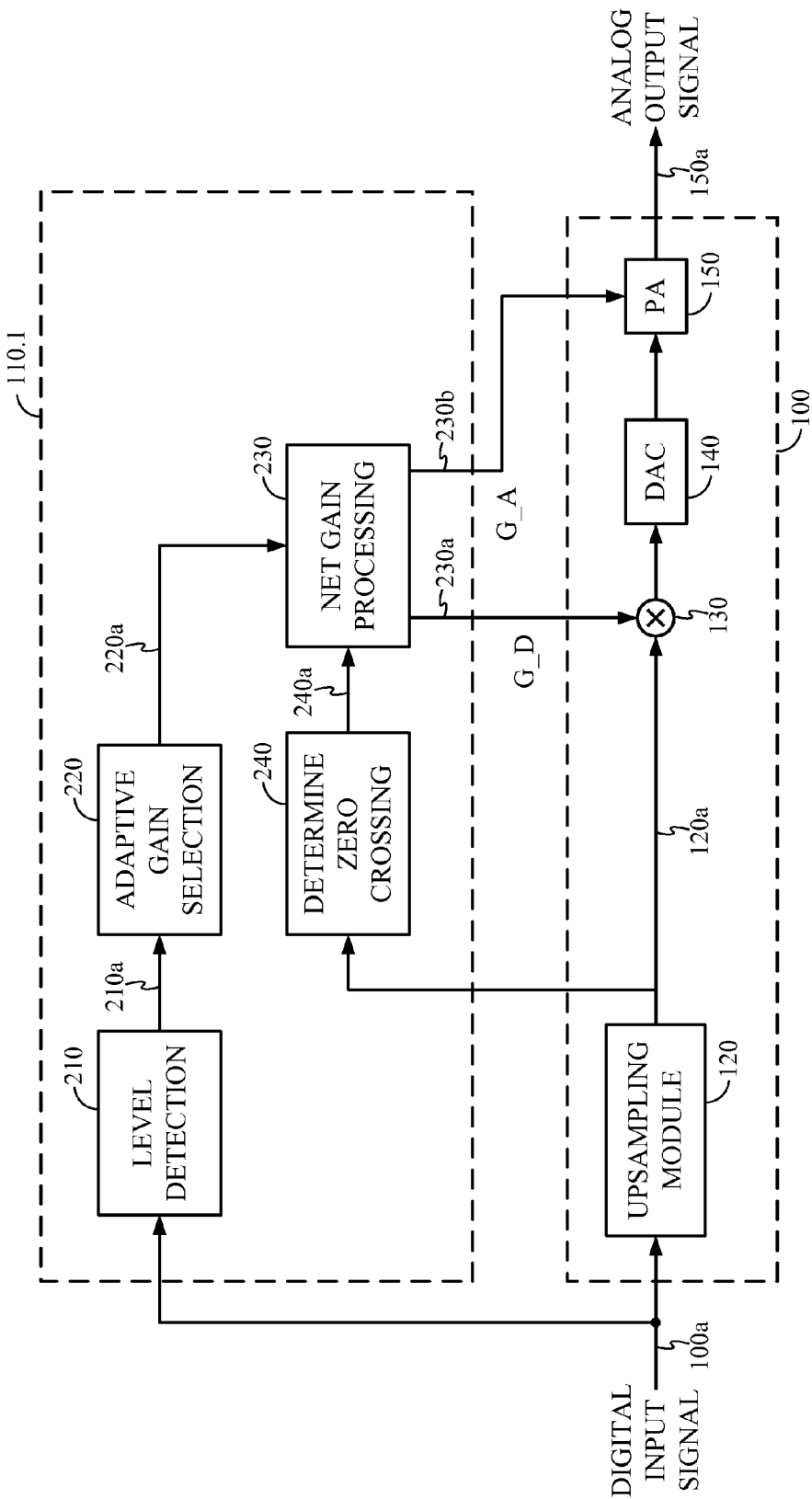
FIG. 2 illustrates an exemplary embodiment of the gain controller.

FIG. 2 illustrates an exemplary embodiment of the gain controller 110. Note the gain controller in FIG. 2 is shown for illustrative purposes only, and is not meant to limit the scope of the present disclosure to any particular exemplary embodiment of a gain controller. Furthermore, one of ordinary skill in the art will appreciate that the logical partitioning into functional blocks shown in FIG. 2, and in the other figures herein, are given for illustrative purposes only, and are not meant to limit the scope of the present disclosure. For example, in alternative exemplary embodiments, it will be appreciated that two or more of the functional blocks shown may be combined into a single functional block for implementation, and similarly, any of the functional blocks shown may be split apart and combined with other functional blocks for implementation. Such alternative exemplary embodiments are contemplated to be within the scope of the present disclosure.

In FIG. 2, the exemplary gain controller 110.1 includes a level detection module 210 for detecting a level of the digital input signal 100a. The level detection module 210 may utilize, e.g., level detection techniques as described with reference to FIG. 3 hereinbelow, or it may utilize any techniques known in the art for detecting the level of a digital signal, including calculating a long-term, intermediate, or short-term average of the digital signal, or applying other filtering or other functions applied to the digital signal level. Note in this description and in the claims, the "level" of a signal may be determined as the output of any function applied to a signal, wherein the function generally varies monotonically with the amplitude or magnitude of the signal.

The output signal 210a of the level detection module 210 is coupled to an adaptive gain selection module 220. The adaptive gain selection module 220 selects target values for gain settings to be applied in the signal path 100 based on the detected level of the digital input signal 100a. The adaptive gain selection module 220 may be configured as further described with reference to FIG. 4 hereinbelow, e.g., it may select a target gain setting based on a predefined zone within which the digital input signal 100a level is determined to fall. Alternatively, the adaptive gain selection module 220 may utilize other techniques to adapt the gains G_D and G_A to the digital input signal 100a level that will be clear to one of ordinary skill in the art in light of the present disclosure.

The output signal 220a of the adaptive gain selection module 220, representing a target gain setting to be applied to the signal path 100 based on the detected level of digital input signal 100a, is provided to a net gain processing module 230. The module 230 is configured to generate the instantaneous digital gain D_G and instantaneous analog gain D_A for the signal path 100, based at least partly on the target gain setting 220a provided by the adaptive gain selection module 220. Note that the indicated target gain setting 220a need not necessarily have a one-to-one correspondence with an instantaneous digital gain G_D or instantaneous analog gain G_A as computed by the module 230. For example, in an exemplary embodiment, the module 230 may adjust the gains D_G and D_A in discrete steps to approach the target gain setting as indicated by the module 220. In a further exemplary embodiment, to lower distortion, the module 230 may also be configured to update the gains G_D and G_A only during time intervals when the upsampled signal 120a is determined to undergo a zero crossing. The presence of such time intervals may be signaled to the net gain processing module 230 by a zero cross detection module 240, whose functionality may be as further described hereinbelow with reference to FIG. 5.

Figure 3:
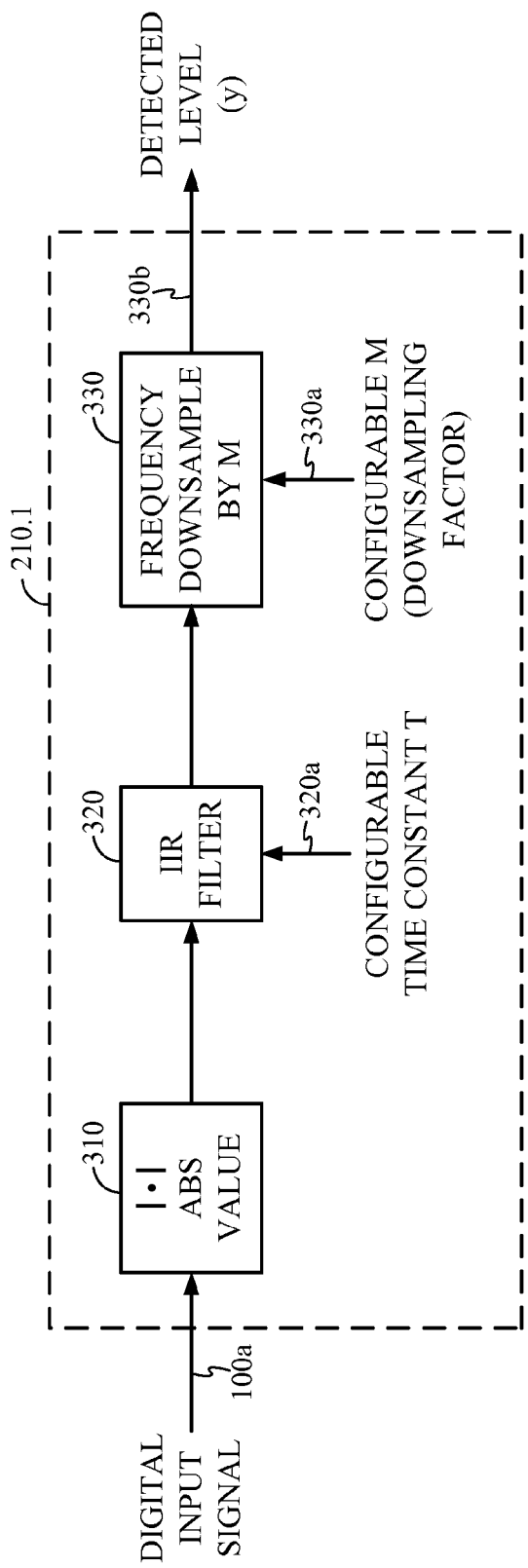
FIG. 3 illustrates an exemplary embodiment of a level detection module according to the present disclosure.

FIG. 3 illustrates an exemplary embodiment of a level detection module 210 according to the present disclosure. Note the level detection module in FIG. 3 is shown for illustrative purposes only, and is not meant to limit the scope of the present disclosure to any particular exemplary embodiment of a level detection module. In alternative exemplary embodiments, any of the blocks shown in FIG. 3 may be omitted, or altered, or combined with each other and/or other functional blocks not shown, to compute the level of the digital input signal 100a. Such alternative exemplary embodiments are contemplated to be within the scope of the present disclosure.

In FIG. 3, the level detection module 210.1 includes an absolute value block 310 for computing an absolute value of the digital input signal 100a. The output of block 310 is provided to an infinite-impulse response (IIR) filter 320 having a configurable time constant T, or 320*a*. The time constant T may be chosen to control the bandwidth of the IIR filter 320. The output of the filter 320 is provided to a frequency downsampling module 330, which downsamples the IIR filter 320 output by a configurable downsampling factor M, or 330*a*. It will be appreciated that downsampling the output of the IIR filter 320 may save computational power while providing less frequent updates of the signal level. As shown in FIG. 3, the output of the level detection module is also denoted herein by the variable y.

Figures 4, 4A:
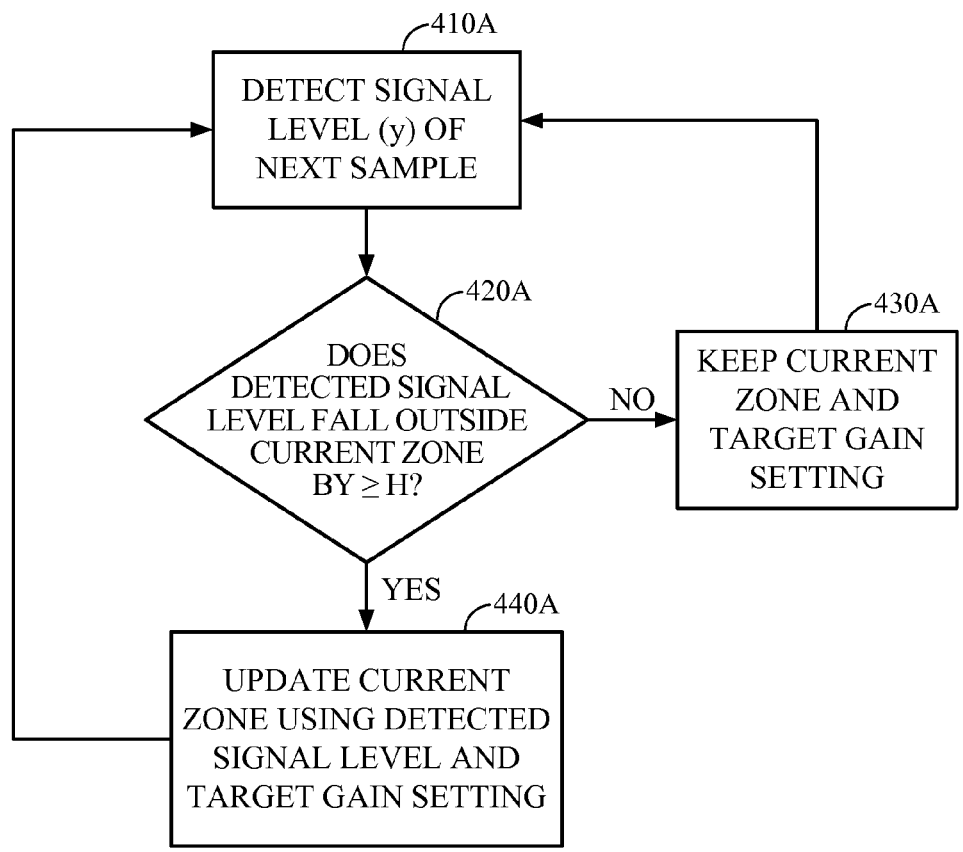
FIG. 4 illustrates an exemplary embodiment of logic that may be performed by the adaptive gain selection module.
FIG. 4A illustrates an exemplary embodiment of a method for deriving the target gain settings using amplitude hysteresis.

FIG. 4 illustrates an exemplary embodiment of logic that may be performed by the adaptive gain selection module 220. Note the embodiment in FIG. 4 is shown for illustrative purposes only, and is not meant to limit the scope of the present disclosure to any particular exemplary embodiment of an adaptive gain selection module.

In FIG. 4, a table 400 is shown for assigning a zone corresponding to the detected input signal level as indicated in the first column 400*a* to a target gain setting as indicated in the second column 400*b*. For example, at row 410 of the table 400, when a detected signal level y is less than a threshold Y.1, a target gain setting of G.1 is assigned. Similarly, at row 420 of the table 400, when a detected signal level y is between thresholds Y.1 and Y.2, a target gain setting of G.2 is assigned, etc., up to row 430, wherein a detected signal level y between thresholds Y.(N−1) and Y.N is assigned to a target gain setting of G.N. In the manner described, the adaptive gain selection module 220 may select a target gain setting corresponding to a detected input signal level. One of ordinary skill in the art will appreciate that the table 400 may be implemented using, e.g., a look-up table programmed in hardware or software, and/or any other techniques known in the art. Such exemplary embodiments are contemplated to be within the scope of the present disclosure.

It will be appreciated that the distribution of thresholds Y.1 through Y.N may be chosen in any manner known to one of ordinary skill in the art. For example, the thresholds may be linearly uniformly distributed over a range, logarithmically linearly distributed over a range, or non-uniformly distributed. The thresholds defining the zones may be fixed over time, or they may themselves be dynamically changed over time depending on the detected signal conditions. For example, any of the thresholds Y.1 through Y.N, as well as the target gain settings G.1 through G.N, may be made dynamically configurable to control the manner in which detected signals are assigned to zones and target gain settings. Such alternative exemplary embodiments are contemplated to be within the scope of the present disclosure.

In a further exemplary embodiment, the adaptive gain selection module 220 may further apply amplitude hysteresis when assigning the detected signal level y to a particular zone. In such an exemplary embodiment, the zone assigned to a signal level is determined by testing to see if the signal level is within a hysteresis window that straddles a zone boundary. The zone assigned may depend on whether the signal moves to within a hysteresis window from above or below the bounds of the hysteresis window. The zone assigned may be determined by how the signal came to be bounded by the hysteresis window (e.g., enters from above or from below).

FIG. 4A illustrates an exemplary embodiment of a method for deriving the target gain settings using amplitude hysteresis. Note FIG. 4A is shown for illustrative purposes only, and is not meant to limit the scope of the present disclosure to any particular methods for deriving target gain settings using hysteresis.

In FIG. 4A, at block 410A, the signal level of a next digital input sample is detected, e.g., as the output of the level detection module 210. In an exemplary embodiment, at block 410A, level detection may be performed using every M-th output sample of the level detection module 210 of FIG. 2, wherein M denotes the downsampling factor as earlier described hereinabove with reference to FIG. 3. In an alternative exemplary embodiment, the parameter M may be used to control the rate at which the target gain setting is updated. Such exemplary embodiments are contemplated to be within the scope of the present disclosure.

At block 420A, a check is performed as to whether the detected signal level is above or below the current zone by an amount greater than a level H, considering hysteresis. The level H may also be denoted herein as the "hysteresis amount." The hysteresis amount may be configurable by, e.g., software control depending on the amount of hysteresis to be applied.

If the check at block 420A returns no, then the method proceeds to block 430A, wherein the current zone as well as the target gain setting remain the same as determined for the previous input digital sample (i.e., are not updated), and the method returns to block 410A.

If the check at block 420A returns yes, then the method proceeds to block 440A, wherein the current zone is updated to be the zone corresponding to the newly detected signal level, and the target gain setting is also updated to correspond to the new zone. Thereafter, the method returns to block 410A.

It will be appreciated that by incorporating amplitude hysteresis into the configuration of the adaptive gain selection module 220, undesirable rapid toggling of the zone (e.g., as described with reference to FIG. 4) and gain due to small rapid changes in the signal level may be avoided in certain cases, e.g., when the signal level is close to the boundaries of a zone.

One of ordinary skill in the art will appreciate that the method shown in FIG. 4A may be implemented using a state machine, wherein the current zone may correspond to a state in the state machine that incorporates the effects of processing all detected signal levels up to the current time. Alternatively, the method may be implemented using other techniques known to one of ordinary skill in the art, and such alternative exemplary embodiments are contemplated to be within the scope of the present disclosure.

Figure 5:
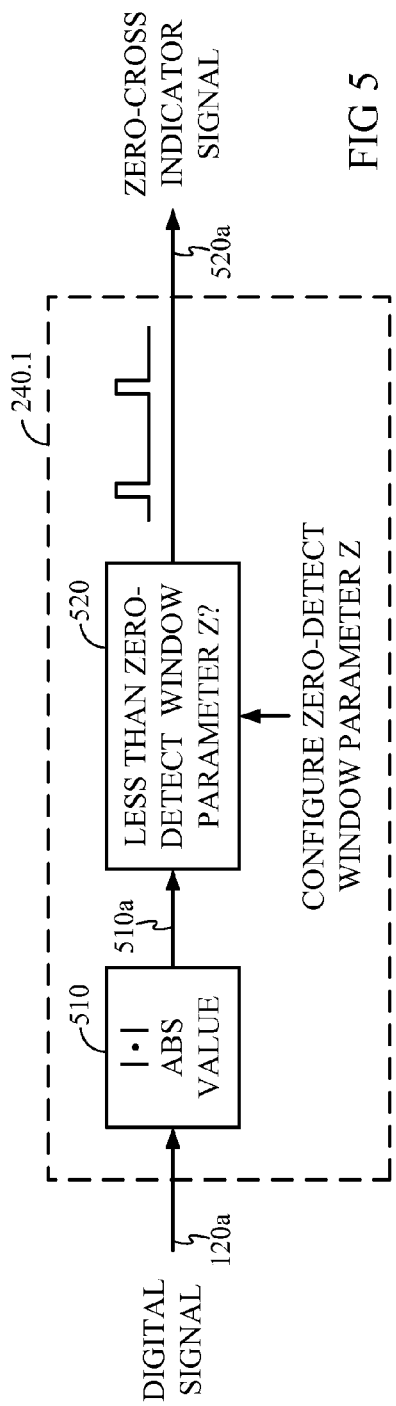
FIG. 5 illustrates an exemplary embodiment of a zero cross detection module.

FIG. 5 illustrates an exemplary embodiment of a zero cross detection module 240. In the exemplary embodiment shown, the zero cross detection module 240.1 is configured to detect zero crossings in the digital signal at the output 120*a* of the upsampling module 120 shown in FIG. 1. One of ordinary skill in the art will appreciate that a zero cross detection module may, in alternative exemplary embodiments, be configured to detect zero crossings elsewhere in the signal path 100, and such alternative exemplary embodiments are contemplated to be within the scope of the present disclosure. Furthermore, implementations of a zero cross detection module other than that shown in FIG. 5 may also be readily derivable by one of ordinary skill in the art in light of the present disclosure.

In FIG. 5, the exemplary zero-detect module 240.1 includes an absolute value block 510 for computing the absolute value 510*a* of the digital signal 120*a*, which may correspond to the output of the upsampling module 120 in FIG. 1. The absolute value 510*a* is provided to a module 520, which generates an output signal 520*a* indicating whether the absolute value 510*a* is less than a zero-detect window parameter Z. In the exemplary embodiment shown, the zero-detect window parameter Z is configurable depending upon the application. It will be appreciated that a relatively small value for Z may be desirable to force gain changes as close to an actual zero crossing as possible, while a larger value for Z may be useful for testing and reset sequencing applications. At the output of the module 520, a pulse signal 520a is shown wherein the positions of the pulses indicate the timing of the zero crossings.

Figure 6:
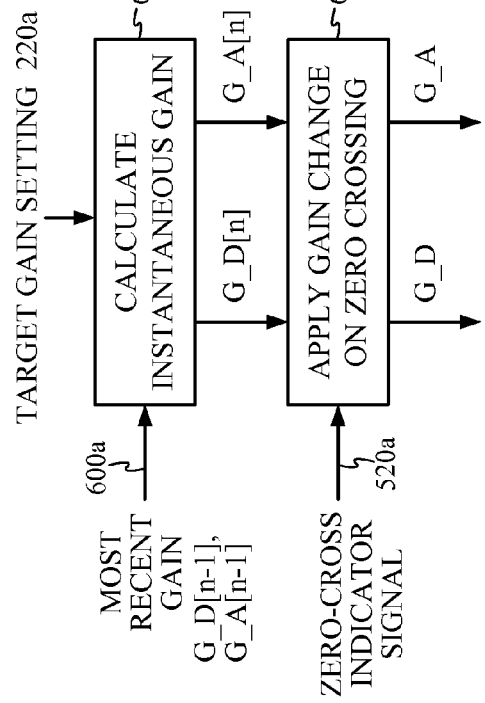
FIG. 6 illustrates an exemplary embodiment of a method performed by the net gain processing module.

FIG. 6 illustrates an exemplary embodiment of a method performed by the net gain processing module 230. Note the exemplary embodiment in FIG. 6 is shown for illustrative purposes only, and is not meant to limit the scope of the present disclosure to any particular exemplary embodiment of the net gain processing module.

In FIG. 6, a target gain setting 220a, e.g., as generated by the adaptive gain selection module 220, is provided as input to an instantaneous gain calculation module 610. The module 610 may also accept a signal 600a indicative of a most recently applied instantaneous digital gain G_D[n−1] and analog gain G_A[n−1], wherein the variable n corresponds to an integer time index, and it will be understood that the gains G_D and G_A may be expressed logarithmically in certain cases for convenience. In an exemplary embodiment, the module 610 may first compute an instantaneous digital gain G_D[n], wherein n indexes the current value of G_D, by, e.g., determining the logarithmic difference between the target digital gain G_D* corresponding to the target gain setting 220a, and the most recently applied digital gain G_D[n−1]. This may indicate whether to increment, decrement, or leave unchanged the instantaneous gain. In an exemplary embodiment, the target digital gain G_D* may have a one-to-one correspondence with each possible target gain setting, e.g., target gain settings G.1 through G.N as described with reference to FIG. 4.

In an exemplary embodiment, in response to the logarithmic difference being positive, negative, or zero, the digital gain G_D[n] may be calculated by adjusting the previously applied digital gain G_D[n−1] by a step size, e.g., 1.5 dB, in the appropriate direction. For example, if the current target gain setting is +10.5 dB, and the previously applied digital gain G_D[n−1] is +6 dB, then the instantaneous digital gain G_D[n] may be calculated as +7.5 dB, assuming a +1.5 dB step size. Conversely, if the previously applied digital gain G_D[n−1] is instead +12 dB, then the instantaneous digital gain G_D[n] may be calculated as +10.5 dB, again assuming a +1.5 dB step size.

Once the instantaneous digital gain G_D[n] is calculated by block 610, then the corresponding instantaneous analog gain G_A[n] may also be calculated, e.g., according to a relation such as G_D[n]+G_A[n]=constant, wherein the values of G_D[n] and G_A[n] are expressed logarithmically. In this manner, the linear values of the digital gain G_D and analog gain G_A are kept inversely proportional to each other such that their product is constant, and thus the overall gain of the signal at the output of the signal path 100 is not affected by the adaptive gain adjustment described herein.

Note that while an exemplary embodiment has been described hereinabove wherein the digital gain G_D is calculated prior to the analog gain G_A, one of ordinary skill in the art will appreciate that in alternative exemplary embodiments, the analog gain G_A may just as readily be calculated prior to the digital gain G_D, and such alternative exemplary embodiments are contemplated to be within the scope of the present disclosure.

The block 610 may provide the calculated instantaneous digital gain G_D[n] and instantaneous analog gain G_A[n] to a block 620 which controls the timing of when to apply the calculated gains to the signal paths. In an exemplary embodiment, updated gain values may be applied only upon detection of a zero crossing in the signal path 100, e.g., as indicated by the output signal 520a also provided to the block 620. In this manner, undesirable glitching in the signal path due to updating of the calculated adaptive gains may be reduced or avoided, thereby lowering distortion.

Figure 7:
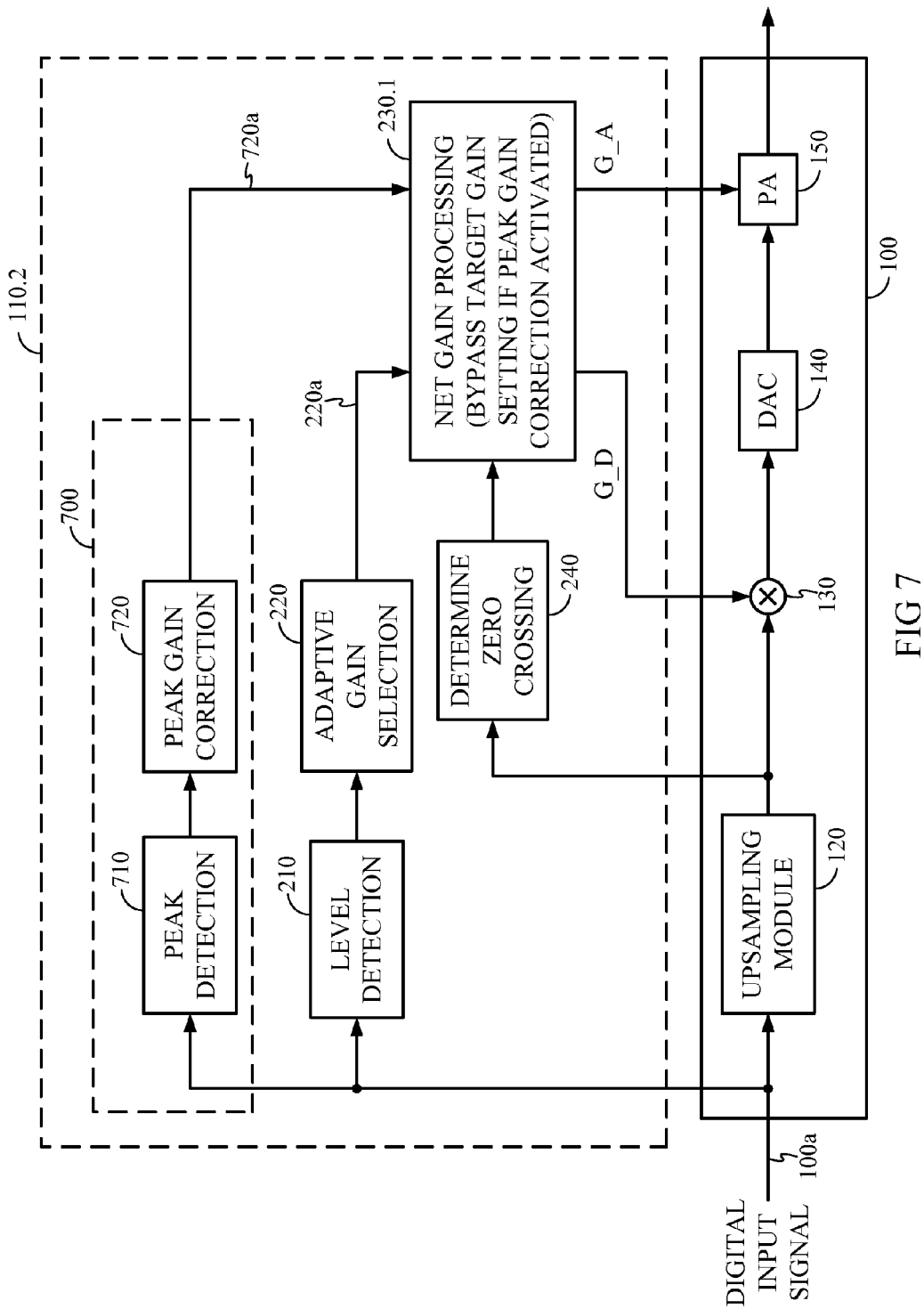
FIG. 7 illustrates an alternative exemplary embodiment of the present disclosure, wherein a peak processing module is provided to refine the calculation of adaptive gain for the signal path.

FIG. 7 illustrates an alternative exemplary embodiment of the present disclosure, wherein a peak processing module 700 is further provided to refine the calculation of adaptive gain for the signal path 100. The peak processing module may function to detect a clipping condition in the digital input signal 100a, and to indicate to the net gain processing module 230 to apply (if needed) a corrective gain to the signal path to prevent undesirable clipping. Note the embodiment in FIG. 7 is shown for illustrative purposes only, and is not meant to limit the scope of the present disclosure to any particular exemplary embodiment of a peak processing module. One of ordinary skill in the art will appreciate that alternative techniques to detect and process peaks in a digital input signal may be derived in light of the principles described herein, and such alternative exemplary embodiments are contemplated to be within the scope of the present disclosure.

In FIG. 7, the exemplary gain controller 110.2 includes a peak detection module 710 coupled to the digital input signal 100a. The peak detection module 710 is configured to compare the absolute value of the digital input signal 100a to a peak threshold level. In an exemplary embodiment, the peak threshold level is determined by the instantaneous digital gain G_D that is currently applied. For example, if the absolute value of the digital input signal 100a is greater than the peak threshold level, then multiplication of such signal by the digital gain G_D may result in undesirable clipping at the output of the DAC 140. The peak detection module 710 indicates the existence of such a peak to the following peak gain correction module 720, which may instantaneously adjust the digital gain G_D to a highest value that will not result in clipping. In the exemplary embodiment shown, the peak gain correction module 720 provides a signal 720a to the net gain calculation module 230.1. The signal 720a may indicate whether peak gain correction is to be activated (e.g., if a peak is detected by module 710), and also may indicate the corrective gain to be applied during such a condition.

In response to receiving an indication that peak gain correction is to be activated, the net gain calculation module 230 may, e.g., bypass the target gain setting 220a, and instead apply the corrective gain indicated by the module 720 for a predetermined timeout period. In an exemplary embodiment, such corrective gain may be applied immediately, regardless of whether a zero cross is detected. Note to timely apply the peak gain correction, the net latency of modules 710, 720, 230, and 130 may be designed to be less than the latency associated with, e.g., the upsampling module 120. Note the multiplier 130 may be provided with the corrective gain before the signal that may cause clipping arrives at 130 for multiplication.

In an exemplary embodiment, if a new peak is detected during an already running timeout period, then the timeout period may be reset to commence with such newly detected peak. Furthermore, a new corrective gain may be applied corresponding to such newly detected clip condition during such new timeout period.

Figure 8:
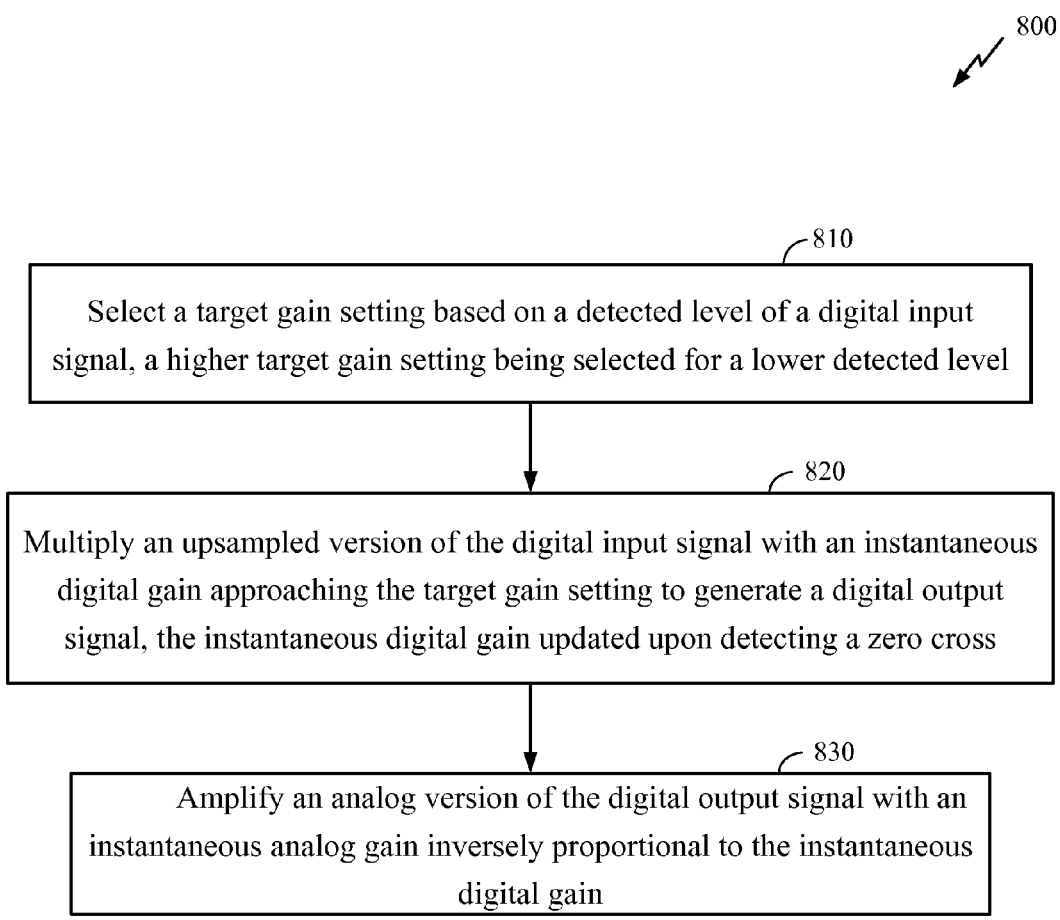
FIG. 8 illustrates an exemplary embodiment of a method according to the present disclosure.

FIG. 8 illustrates an exemplary embodiment of a method according to the present disclosure. Note the method of FIG. 8 is shown for illustrative purposes only, and is not meant to limit the scope of the present disclosure to any particular method described.

In FIG. 8, at block 810, a target gain setting is selected based on a detected level of the digital input signal, a higher target gain setting being selected for a lower detected level.

At block 820, an upsampled version of the digital input signal is multiplied with an instantaneous digital gain approaching the target gain setting to generate a digital output signal. The instantaneous digital gain may be updated upon detecting a zero cross in the upsampled version of the digital input signal.

At block 830, an analog version of the digital output signal is amplified with an instantaneous analog gain inversely proportional to the instantaneous digital gain.

In an exemplary embodiment, the techniques of the present disclosure may be applied to designing a system for dynamic range enhancement and power consumption reduction in audio CODEC's. FIG. 9 illustrates an exemplary embodiment of a signal path and associated processing for an audio CODEC according to the techniques of the present disclosure. Note the techniques described are shown for illustrative purposes only, and are not meant to limit the scope of the present disclosure to any particular application of the disclosed adaptive gain adjustment techniques.

In FIG. 9, a pulse-code modulated (PCM) signal 900a is provided as input to a signal path 902. The PCM signal 900a may be, e.g., a digital signal output by an audio CODEC such as used in cellular wireless communications, digital landline communications, digital audio playback, or any other application known in the art. For illustrative purposes, the signal 900a is denoted to be a 21-bit signed integer, although it will be appreciated that digital signals having arbitrary bitwidths may be supported in alternative exemplary embodiments.

The signal 900a is provided to an interpolation module 912 that upsamples the signal 900a in frequency to increase the digital sampling rate. For example, the module 912 may upsample the signal 900a 64, 128, or 256 times in frequency. The module 912 may include, e.g., a zero-order hold (ZOH) module, a CIC filter, or other types of interpolation filters known in the art. The output of module 912 is coupled to a multiply/saturate module 916. The module 916 may further be provided with a digital gain G_D 958a to be multiplied with the output of the interpolation module 912. The output of module 916 is subsequently provided to a noise shaper 918 and a DAC module 920 that converts the digital signal to an analog signal. The output of DAC module 920 is coupled to a power amplifier 922, whose gain is configured according to the signal G_A 958b, as further described hereinbelow and in accordance with the principles of the present disclosure.

Parallel to the signal path 902 is provided a level detection module 930, which detects a level of the input PCM signal 900a. The level detection module 930 may further accept a programmable time constant input 930a, e.g., as previously described herein with reference to FIG. 3. The output of module 930 is downsampled by a programmable factor M, as also previously described herein with reference to FIG. 3. The output of module 932 is provided to a gain calculation module 950. Further parallel to the signal 902 is provided a peak detection module 940, which detects the presence of peaks in the input PCM signal 900a. The peak detection module 940 may further accept a programmable timeout window 940a, as previously described herein with reference to FIG. 7. The output of module 940 is also provided to the gain calculation module 950.

The gain calculation module 950 includes a peak handler 952, which generates a corrective gain to be applied in case a peak is detected in the input PCM signal 900a, as earlier described herein with reference to FIG. 7. The gain calculation module 950 further includes a gain zone selection module 954 for selecting a target gain setting based on the detected levels of the input PCM signal, as earlier described herein with reference to FIG. 4. In the exemplary embodiment shown, the module 954 may accept programmable gain thresholds 954a and a programmable hysteresis window 954b, as also earlier described herein with reference to FIG. 4. The module 950 further includes an instantaneous gain computation module 956, which may perform the functionality described herein with reference to FIG. 6. The module 950 may further include a zero cross detection and digital/analog gain writing module 958, as earlier described herein with reference to FIGS. 5 and 6.

It will be appreciated that the functionality described herein with reference to FIGS. 1-8 may be variously combined and partitioned into alternative functional blocks, as shown in FIG. 9. For example, the functionality of blocks 220 and 230 in FIG. 2 are shown as being combined in block 950 of FIG. 9. These and other modifications will be clear to one of ordinary skill in the art, and are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus for processing a digital input signal having a sampling frequency, the apparatus comprising:
    an adaptive gain selection module for selecting a target gain setting based on a detected level of the digital input signal, a higher target gain setting being selected for a lower detected level;
    a digital multiplier for multiplying an upsampled version of the digital input signal with an instantaneous digital gain approaching the target gain setting to generate a digital output signal, the instantaneous digital gain updated upon detection of a zero cross in the upsampled version of the digital input signal; and
    an amplifier for amplifying an analog version of the digital output signal with an instantaneous analog gain inversely proportional to the instantaneous digital gain.

2. The apparatus of claim 1, further comprising an element to adjust the instantaneous digital gain to approach the target gain setting in fixed decibel increments.

3. The apparatus of claim 1, further comprising a level detection module which filters the absolute value of the digital input signal with a configurable time constant to generate the detected level of the digital input signal.

4. The apparatus of claim 3, the level detection module further downsampling the filtered value by a configurable factor to generate a signal indicating the detected level of the digital input signal.

5. The apparatus of claim 1, the adaptive gain selection module assigning a target gain setting based on the detected level of the digital input signal falling within one of a plurality of predefined zones, each zone being defined by at least one configurable threshold.

6. The apparatus of claim 5, the adaptive gain selection module assigning the detected level of the digital input signal to one of the predefined zones based on whether such detected level lies outside such predefined zone by a configurable hysteresis amount.

7. The apparatus of claim 1, further comprising a zero cross detection module detecting the zero cross of the upsampled signal based on whether the absolute value of the upsampled signal is greater or less than a configurable zero detect window parameter.

8. The apparatus of claim 1, further comprising:
    a peak detection module detecting a peak level of the digital input signal; the apparatus reducing the instantaneous digital gain applied by the digital multiplier in response to the detected peak level being greater than a peak threshold level.

9. The apparatus of claim 8, the peak threshold level being inversely proportional to the instantaneous digital gain.

10. The apparatus of claim 8, further comprising a peak gain correction module which adjusts the instantaneous digital gain to be a value that will result in no clipping by the multiplier in response to the detected peak level being greater than a threshold determined by the instantaneous digital gain.

11. The apparatus of claim 8, the apparatus further holding the reduced instantaneous digital gain for a configurable timeout period in response to the detected peak level being greater than the threshold determined by the instantaneous digital gain.

12. The apparatus of claim 11, the apparatus further comprising elements to, in response to detecting a second peak level greater than the threshold determined by the instantaneous gain during a running timeout period:
    reduce the instantaneous digital gain applied by the digital multiplier in response to the second detected peak level; and
    hold the reduced instantaneous digital gain for the configurable timeout period commencing with the detection of said second detected peak level.

13. The apparatus of claim 1, the digital input signal comprising a digital audio signal, the apparatus further comprising an upsampling module including an interpolator.

14. The apparatus of claim 1, further comprising an upsampling module for generating the upsampled version of the digital input signal, the upsampling module including a zero-order hold module.

15. The apparatus of claim 1, further comprising an upsampling module for generating the upsampled version of the digital input signal, the upsampling module including a CIC filter.

16. The apparatus of claim 1, the amplifier comprising a power amplifier having adjustable analog gain.

17. A method for processing a digital input signal having a sampling frequency, the method comprising:
selecting a target gain setting based on a detected level of the digital input signal, a higher target gain setting being selected for a lower detected level;
multiplying an upsampled version of the digital input signal with an instantaneous digital gain approaching the target gain setting to generate a digital output signal, the instantaneous digital gain updated upon detecting a zero cross in the upsampled version of the digital input signal; and
amplifying an analog version of the digital output signal with an instantaneous analog gain inversely proportional to the instantaneous digital gain.

18. The method of claim 17, further comprising configuring the instantaneous digital gain to approach the target gain setting in fixed decibel increments.

19. The method of claim 17, further comprising detecting the level of the digital input signal by filtering the absolute value of the digital input signal with a configurable time constant.

20. The method of claim 19, the detecting the level of the digital input signal comprising downsampling the filtered value by a configurable factor to generate a signal indicating the detected level of the digital input signal.

21. The method of claim 17, the selecting the target gain setting comprising assigning a target gain setting based on the detected level of the digital input signal falling within one of a plurality of predefined zones, each zone being defined by at least one configurable threshold.

22. The method of claim 21, the selecting the target gain setting further comprising assigning the detected level of the digital input signal to one of the predefined zones based on whether such detected level lies outside such predefined zone by a configurable hysteresis amount.

23. The method of claim 17, further comprising detecting the zero cross by detecting whether the absolute value of the upsampled signal is greater or less than a configurable zero detect window parameter.

24. The method of claim 17, further comprising:
detecting a peak level of the digital input signal; and
reducing the instantaneous digital gain in response to the detected peak level being greater than a peak threshold level.

25. The method of claim 24, the peak threshold level being inversely proportional to the instantaneous digital gain.

26. The method of claim 24, further comprising adjusting the instantaneous digital gain to be a value that will result in no clipping when generating the analog version of the digital output signal.

27. The method of claim 24, further comprising holding the reduced instantaneous digital gain for a configurable timeout period in response to the detected peak level being greater than the threshold determined by the instantaneous digital gain.

28. The method of claim 27, further comprising, in response to detecting a second peak level greater than the threshold determined by the instantaneous gain during a running timeout period:
reducing the instantaneous digital gain applied by the digital multiplier in response to the second detected peak level; and
holding the reduced instantaneous digital gain for the configurable timeout period commencing with detecting said second detected peak level.

29. The method of claim 17, the digital input signal comprising a digital audio signal, the method further comprising upsampling the digital input signal by interpolating and applying a zero-order hold.

30. The method of claim 17, the method further comprising upsampling the digital input signal by applying a CIC filter.

31. The method of claim 17, the amplifying the DAC output signal further comprising amplifying with an adjustable gain to generate an analog output, and further amplifying the analog version of the digital output signal by a power amplifier.

32. An apparatus for processing a digital input signal having a sampling frequency, the apparatus comprising:
means for selecting a target gain setting based on the detected level of the digital input signal;
means for multiplying an upsampled version of the digital input signal with an instantaneous digital gain approaching the target gain setting to generate a digital output signal; and
means for amplifying an analog version of the digital output signal with an instantaneous analog gain inversely proportional to the instantaneous digital gain.

* * * * *